United States Patent
Campbell

(10) Patent No.: US 11,280,836 B2
(45) Date of Patent: Mar. 22, 2022

(54) FAILURE DETECTION IN SMALL AC MOTORS

(71) Applicant: Rockwell Collins, Inc., Cedar Rapids, IA (US)

(72) Inventor: Thomas B. Campbell, Cedar Rapids, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 31 days.

(21) Appl. No.: 16/872,063

(22) Filed: May 11, 2020

(65) Prior Publication Data

US 2021/0349148 A1 Nov. 11, 2021

(51) Int. Cl.
*G01R 31/34* (2020.01)
*G01R 31/72* (2020.01)

(52) U.S. Cl.
CPC ........... *G01R 31/346* (2013.01); *G01R 31/72* (2020.01)

(58) Field of Classification Search
CPC .............................. G01R 31/346; G01R 31/72
See application file for complete search history.

(56) References Cited

U.S. PATENT DOCUMENTS

| | | | | |
|---|---|---|---|---|
| 4,204,425 A | * | 5/1980 | Mallick, Jr. | .......... G01R 31/343 322/99 |
| 9,160,252 B1 | | 10/2015 | Pullen | |
| 2008/0018285 A1 | * | 1/2008 | Wu | .......... H02P 23/14 324/161 |
| 2008/0191651 A1 | * | 8/2008 | Doglioni Majer | ........ H02P 7/28 318/449 |
| 2008/0258663 A1 | * | 10/2008 | Walls | .................... H02P 7/2913 318/459 |

FOREIGN PATENT DOCUMENTS

| | | | | |
|---|---|---|---|---|
| DE | 3839535 A1 | * | 5/1990 | ............. F23N 3/082 |
| EP | 0031688 A3 | | 10/1981 | |
| JP | 2006262679 A | * | 9/2006 | ............. F23N 3/082 |
| WO | 2009148197 A1 | | 12/2009 | |

OTHER PUBLICATIONS

AC motor, available on Apr. 18, 2019 at https://web.archive.org/web/20190418114348/https://en.wikipedia.org/wiki/AC_motor#Permanent-split_capacitor_motor (Year: 2019).*
Search Report for European Application No. 21173386.0 dated Sep. 24, 2021, 8 pages.

* cited by examiner

*Primary Examiner* — Daniel R Miller
(74) *Attorney, Agent, or Firm* — Suiter Swantz pc llo

(57) ABSTRACT

A system and method for detecting failures in a single-phase AC motor is disclosed. After a startup sequence, the motor is unpowered and a measurement is taken across terminals in the motor to detect a signal from residual magnetism in the iron core of the rotor. If the rotor was successfully started, the signal will be above a predetermined threshold. The signal may be measured across either a main stator winding or a start stator winding. Where the signal does not exceed the predetermined threshold, the startup sequence may be re-initiated and/or a failure message may be sent to an operator.

11 Claims, 2 Drawing Sheets

FAILURE DETECTION IN SMALL AC MOTORS

BACKGROUND

Most electronic systems installed on aircraft require cooling air for proper operation. Some of these systems integrate fans to provide the cooling air. A small AC machine is typically used to drive the fan. Built-in-test monitoring of AC machines is typically limited to measurement of current draw.

The AC machines used in these fans are typically permanent split capacitor induction motors. Such motors are single-phase AC motors with two windings. The windings are physically orientated 90 degrees to each other and driven from a single-phase AC power source with a start winding shifted electrically in phase from the main winding via the use of a capacitor. This results in the rotating magnetic field that is required to start the rotation of the fan.

Measuring current draw may be misleading because current draw of the motor may not fluctuate significantly for an open circuit. The start and main windings are connected in parallel and an open circuit in one path may not be detected by the built-in-test circuity. Moreover, fan manufacturers typically implement multiple poles (i.e. windings) within the machine and may connect these in parallel. This makes detecting an open winding even more difficult.

Finally, the machines used within the fans are designed to be small, not efficient. The current draw difference between a spinning fan and one with a stalled motor is not large enough to be used for a reliable built-in-test measurement.

SUMMARY

In one aspect, embodiments of the inventive concepts disclosed herein are directed to a system and method for detecting failures in a single-phase AC motor. After a startup sequence, the motor is unpowered and a measurement is taken across terminals in the motor to detect a signal from residual magnetism in the iron core of the rotor. If the rotor was successfully started, the signal will be above a predetermined threshold.

In a further aspect, the signal may be measured across either a main stator winding or a start stator winding. Where the signal does not exceed the predetermined threshold, the startup sequence may be re-initiated and/or a failure message may be sent to an operator.

It is to be understood that both the foregoing general description and the following detailed description are exemplary and explanatory only and should not restrict the scope of the claims. The accompanying drawings, which are incorporated in and constitute a part of the specification, illustrate exemplary embodiments of the inventive concepts disclosed herein and together with the general description, serve to explain the principles.

BRIEF DESCRIPTION OF THE DRAWINGS

The numerous advantages of the embodiments of the inventive concepts disclosed herein may be better understood by those skilled in the art by reference to the accompanying figures in which.

DETAILED DESCRIPTION

Figure 1:
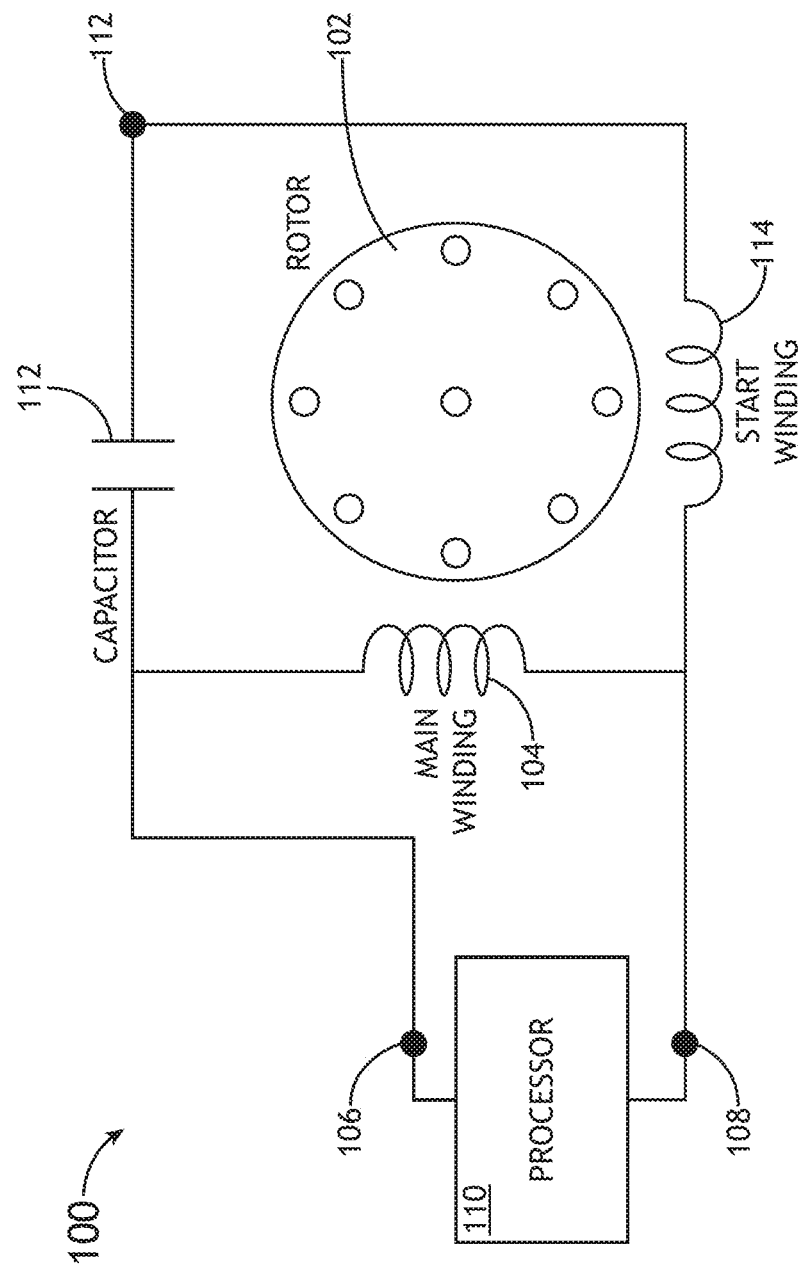
FIG. 1 shows a block diagram of a system for detecting motor failure according to an exemplary embodiment.

Before explaining at least one embodiment of the inventive concepts disclosed herein in detail, it is to be understood that the inventive concepts are not limited in their application to the details of construction and the arrangement of the components or steps or methodologies set forth in the following description or illustrated in the drawings. In the following detailed description of embodiments of the instant inventive concepts, numerous specific details are set forth in order to provide a more thorough understanding of the inventive concepts. However, it will be apparent to one of ordinary skill in the art having the benefit of the instant disclosure that the inventive concepts disclosed herein may be practiced without these specific details. In other instances, well-known features may not be described in detail to avoid unnecessarily complicating the instant disclosure. The inventive concepts disclosed herein are capable of other embodiments or of being practiced or carried out in various ways. Also, it is to be understood that the phraseology and terminology employed herein is for the purpose of description and should not be regarded as limiting.

As used herein a letter following a reference numeral is intended to reference an embodiment of the feature or element that may be similar, but not necessarily identical, to a previously described element or feature bearing the same reference numeral (e.g., 1, 1a, 1b). Such shorthand notations are used for purposes of convenience only, and should not be construed to limit the inventive concepts disclosed herein in any way unless expressly stated to the contrary.

Further, unless expressly stated to the contrary, "or" refers to an inclusive or and not to an exclusive or. For example, a condition A or B is satisfied by anyone of the following: A is true (or present) and B is false (or not present), A is false (or not present) and B is true (or present), and both A and B are true (or present).

In addition, use of the "a" or "an" are employed to describe elements and components of embodiments of the instant inventive concepts. This is done merely for convenience and to give a general sense of the inventive concepts, and "a" and "an" are intended to include one or at least one and the singular also includes the plural unless it is obvious that it is meant otherwise.

Finally, as used herein any reference to "one embodiment," or "some embodiments" means that a particular element, feature, structure, or characteristic described in connection with the embodiment is included in at least one embodiment of the inventive concepts disclosed herein. The appearances of the phrase "in some embodiments" in various places in the specification are not necessarily all referring to the same embodiment, and embodiments of the inventive concepts disclosed may include one or more of the features expressly described or inherently present herein, or any combination of sub-combination of two or more such features, along with any other features which may not necessarily be expressly described or inherently present in the instant disclosure.

Broadly, embodiments of the inventive concepts disclosed herein are directed to a system and method for detecting failures in a single-phase AC motor. After a startup sequence, the motor is unpowered and a measurement is taken across terminals in the motor to detect a signal from residual magnetism in the iron core of the rotor. If the rotor was successfully started, the signal will be above a predetermined threshold. Where the signal does not exceed the predetermined threshold, the startup sequence may be re-initiated and/or a failure message may be sent to an operator.

Referring to FIG. 1, a block diagram of a system 100 for detecting motor failure according to an exemplary embodiment is shown. A single-phase AC motor useful to cool electronic components in avionics computer systems may comprise an AC induction motor. Induction motors are a class of AC motors where a shorted electrical circuit is fastened to the rotating part of the machine (the rotor 102), oriented appropriately in a rotating magnetic field. The rotating magnetic field induces a current in the shorted electrical circuit, which in turn develops an opposing magnetic field which then causes the rotor 102 to turn.

In at least one embodiment, the AC motor comprises a rotor 102 and a stator with laminated iron (or other ferrous metal) cores that create the rotating magnetic field via one or more main stator windings 104 that drive the rotor 102. The laminated cores are not magnetically neutral; they have a residual magnetic field from use. The rotating magnetic field in the stator is developed by angular orientation of the main stator windings 104 to each other as well as the phase relationship of the current driving the main stator windings 104. An AC signal is applied to the main stator winding 104 via two power terminals 106, 108. During startup, a processor 110 executes a startup sequence to start the rotor 102 spinning. The maximum rotational speed of the rotor 102 is determined by the frequency of the AC signal; for example, when driven with 400 Hz aircraft power, the rotor 102 may rotate up to 24,000 rpm (400 Hz*60 sec/min=24,000 rpm).

When the motor is faulted, the startup sequence will fail to start the rotor 102 spinning. In at least one embodiment, a processor 110 stops powering the terminals 106, 108 and instead monitors the terminals 106, 108 for a signal. Residual magnetism in the laminated cores of the stator induces a current to flow in the rotor 102. Current in the rotor 102 causes a magnetic field to develop in the rotor 102. A spinning rotor 102 will induce a small voltage in the main stator windings 104 that may be detected by the processor 110 at the terminals 106, 108. If that voltage is above a predetermined threshold, for example 50 mVAC, then the processor 110 may determine that the rotor 102 was spinning and continue to apply the normal operating power to the terminals 106, 108. Alternatively, if the voltage is not above the predetermined threshold, the processor 110 may re-initiate the startup sequence and/or send an alert to an operator that the motor may have failed.

In at least one embodiment, the motor may include a start stator winding 114 useful for applying additional torque to the rotor 102 during the startup sequence; the start stator winding 114 is generally not utilized otherwise. When the processor 110 stops powering the terminals 106, 108, it may disconnect a starting capacitor 112 and monitor alternate terminals 108, 116 across the start stator winding 114. In such embodiments, the predetermined threshold may be less than for similar signals across the main stator windings 104. Fields developed by the main stator windings 104 may couple over to the start stator winding 114 and cause a false sense voltage; therefore, in at least one embodiment, signals across the start stator windings 114 may be measured with respect to a signal across the main stator winding 104 to compensate for coupling.

It may be appreciated that different signals or signal components may be monitored. For example, in some embodiments, current or frequency domain impedance may be monitored; likewise, the processor 110 may monitor changes over time (diminishing voltage at the terminals 106, 108, 116).

Figure 2:
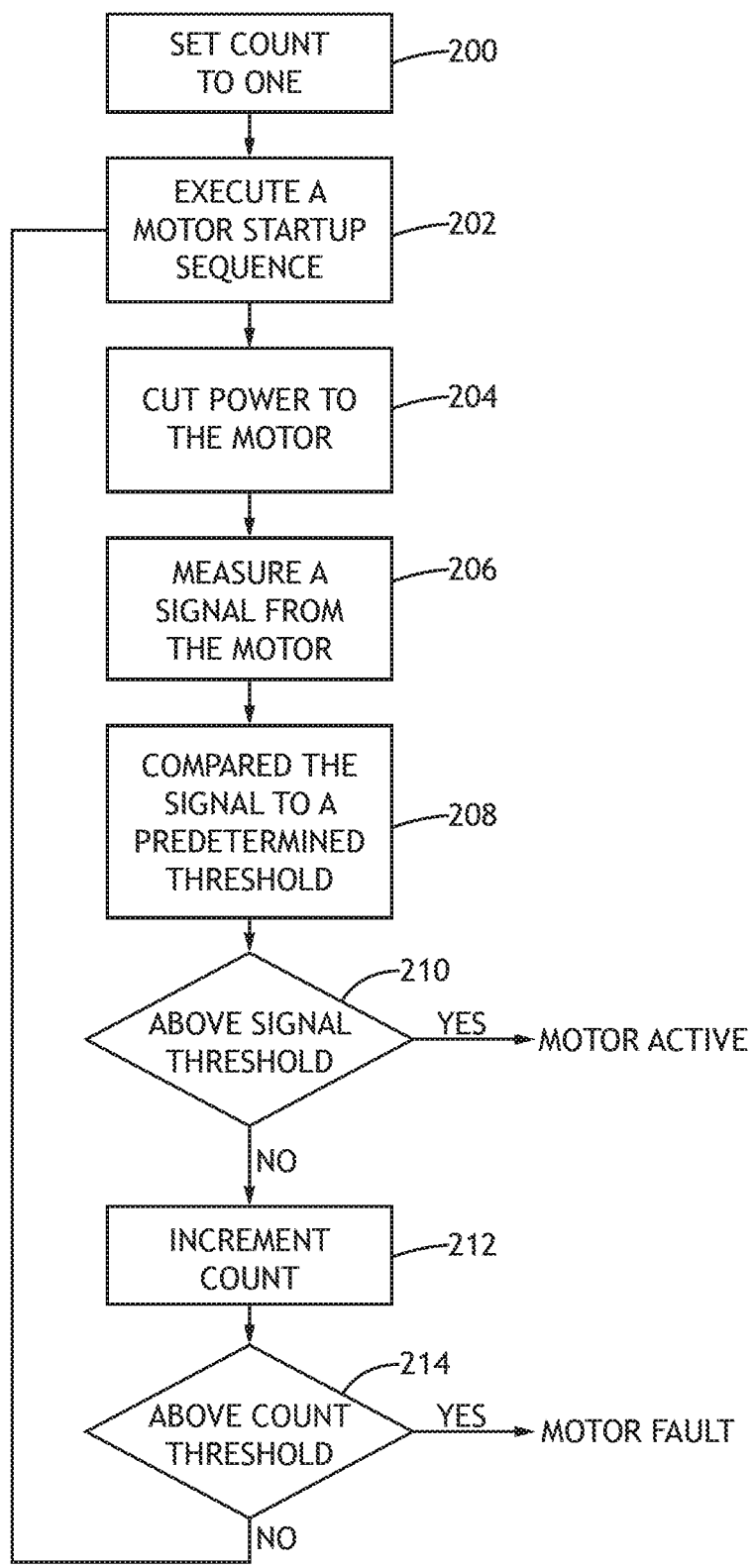
FIG. 2 shows a flowchart of a method for detecting motor failure according to an exemplary embodiment.

Referring to FIG. 2, a flowchart of a method for detecting motor failure according to an exemplary embodiment is shown. At startup, a processor sets 200 a start counter and executes 202 a motor startup sequence. After the motor has sufficient time to reach full speed, the processor cuts 204 power to the motor and begins measuring 206 signals from the motor terminals. The signals, such as an induced voltage in the main stator windings from a rotating rotor, are compared 208 to a predetermined threshold. If the processor determines 210 the signals are above that threshold, the processor may determine that the motor was spinning and continue to power the motor normally. If the processor determines 210 the signals are below that threshold, the processor may determine that the motor was not spinning and send a fault message to the appropriate avionics system. Alternatively, or in addition, the processor may increment 212 the start counter. If the processor determines 214 that the start counter is below a threshold, it may re-execute 202 the motor startup sequence which may break the rotor free in the event it was stalled from contaminants (i.e. salt, dirt, dust, etc.). If the processor determines 214 that the start counter exceeds the threshold of restarts, a fault message may be sent to the appropriate avionics system.

It may be appreciated that while certain specific embodiments describe application to single-phase AC motors, embodiments may be applied to multi-phased motors, including three-phased motors.

It is believed that the inventive concepts disclosed herein and many of their attendant advantages will be understood by the foregoing description of embodiments of the inventive concepts disclosed, and it will be apparent that various changes may be made in the form, construction, and arrangement of the components thereof without departing from the broad scope of the inventive concepts disclosed herein or without sacrificing all of their material advantages; and individual features from various embodiments may be combined to arrive at other embodiments. The form herein before described being merely an explanatory embodiment thereof, it is the intention of the following claims to encompass and include such changes. Furthermore, any of the features disclosed in relation to any of the individual embodiments may be incorporated into any other embodiment.

What is claimed is:

1. A system comprising:
   an AC motor; and
   at least one processor connected to the AC motor, the at least one processor configured to:
   activate the AC motor;
   stop powering the AC motor;
   disconnect a starting capacitor from a start stator winding of the AC motor;
   measure a main signal from the AC motor via a main stator winding;
   measure a start signal from the AC motor via the start stator winding; and
   compare the main signal to the start signal and to a predetermined threshold to determine if a rotor of the motor is spinning.

2. The system of claim 1, wherein the processor is further configured to periodically stop powering the AC motor and re-measure the main signal and the star signal.

3. The system of claim 1, wherein the processor is further configured to repower the AC motor after a predetermined duration, the predetermined duration configured to be shorter than a spin-down time of the rotor during normal operation.

4. The system of claim 1, wherein the processor is further configured to execute a startup sequence when the processor determines that the rotor is not spinning.

5. The system of claim 1, wherein the processor is further configured to send a failure message to an operator.

6. An avionics system comprising:
- a single-phase AC motor disposed to cool an avionics computer system; and
- at least one processor connected to the single-phase AC motor, the at least one processor configured to:
    - activate the single-phase AC motor;
    - stop powering the single-phase AC motor;
    - disconnect a starting capacitor from a start stator winding of the AC motor;
    - measure a main signal from the AC motor via a main stator winding;
    - measure a start signal from the AC motor via the start stator winding; and
    - compare the main signal to the start signal and to a predetermined threshold to determine if a rotor of the motor is spinning.

7. The avionics system of claim 6, wherein the predetermined threshold is 50 mVAC.

8. The avionics system of claim 6, wherein the processor is further configured to send a failure message to an operator.

9. The avionics system of claim 6, wherein the processor is further configured to periodically stop powering the single-phase AC motor and re-measure the main signal and start signal.

10. The avionics system of claim 9, wherein the processor is further configured to repower the single-phase AC motor after a predetermined duration, the predetermined duration configured to be shorter than a spin-down time of the rotor during normal operation.

11. The avionics system of claim 10, wherein the processor is further configured to execute a startup sequence when the processor determines that the rotor is not spinning.

\* \* \* \* \*